(12) United States Patent
Hiramatsu et al.

(10) Patent No.: US 9,337,322 B2
(45) Date of Patent: May 10, 2016

(54) THIN-FILM TRANSISTOR AND METHOD FOR MANUFACTURING THE SAME

(71) Applicant: Japan Display Inc., Minato-ku (JP)

(72) Inventors: Masato Hiramatsu, Tokyo (JP); Masayoshi Fuchi, Tokyo (JP); Arichika Ishida, Tokyo (JP)

(73) Assignee: JAPAN DISPLAY INC., Minato-ku (JP)

( * ) Notice: Subject to any disclaimer, the term of this patent is extended or adjusted under 35 U.S.C. 154(b) by 0 days.

(21) Appl. No.: 14/729,117

(22) Filed: Jun. 3, 2015

(65) Prior Publication Data

US 2015/0263142 A1    Sep. 17, 2015

Related U.S. Application Data

(63) Continuation of application No. 14/256,267, filed on Apr. 18, 2014.

(30) Foreign Application Priority Data

May 21, 2013  (JP) .................................. 2013-107376

(51) Int. Cl.
*H01L 29/66* (2006.01)
*H01L 29/786* (2006.01)
*H01L 29/49* (2006.01)
*H01L 21/02* (2006.01)
*H01L 21/465* (2006.01)

(52) U.S. Cl.
CPC ...... *H01L 29/66969* (2013.01); *H01L 21/0262* (2013.01); *H01L 21/02164* (2013.01); *H01L 21/02211* (2013.01); *H01L 21/02214* (2013.01); *H01L 21/02271* (2013.01); *H01L 21/02565* (2013.01); *H01L 21/465* (2013.01); *H01L 29/4908* (2013.01); *H01L 29/7869* (2013.01)

(58) Field of Classification Search
None
See application file for complete search history.

(56) References Cited

U.S. PATENT DOCUMENTS

| | | | |
|---|---|---|---|
| 8,790,967 B2 | 7/2014 | Park et al. | |
| 2007/0034871 A1 | 2/2007 | Itoh et al. | |
| 2009/0101911 A1* | 4/2009 | Kim | H01L 29/66757 257/66 |
| 2009/0289250 A1 | 11/2009 | Hoffman et al. | |
| 2010/0117155 A1* | 5/2010 | Kitakado | H01L 27/1237 257/368 |
| 2011/0168993 A1 | 7/2011 | Jeon et al. | |
| 2013/0187164 A1* | 7/2013 | Oshima | H01L 29/78693 257/59 |
| 2013/0248856 A1* | 9/2013 | Nakazawa | H01L 27/1225 257/43 |
| 2014/0117320 A1* | 5/2014 | Jung | H01L 27/3276 257/40 |

FOREIGN PATENT DOCUMENTS

JP    2007-48934    2/2007

* cited by examiner

*Primary Examiner* — Ali Naraghi
(74) *Attorney, Agent, or Firm* — Oblon, McClelland, Maier & Neustadt, L.L.P.

(57) ABSTRACT

According to one embodiment, a thin-film transistor comprises an oxide semiconductor layer formed on a part of a substrate, a first gate insulator film of a silicon dioxide film formed on the oxide semiconductor layer and by the CVD method with a silane-based source gas, a second gate insulator film of a silicon dioxide film formed on the first gate insulator film by the CVD method with a TEOS source gas, and a gate electrode formed on the second gate insulator film.

4 Claims, 4 Drawing Sheets

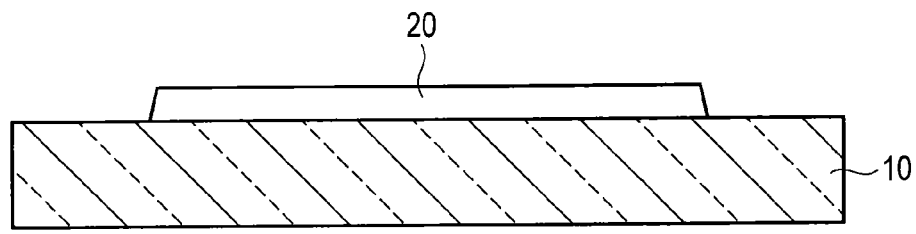
F I G. 4A
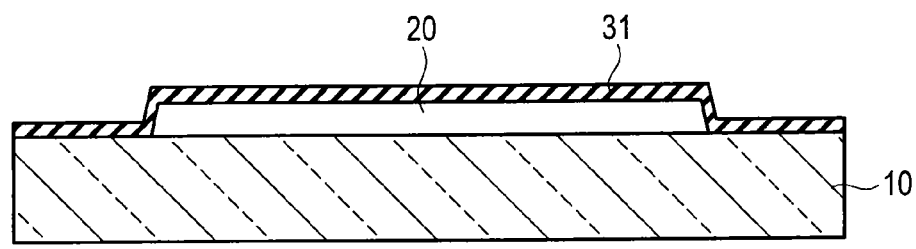
F I G. 4B
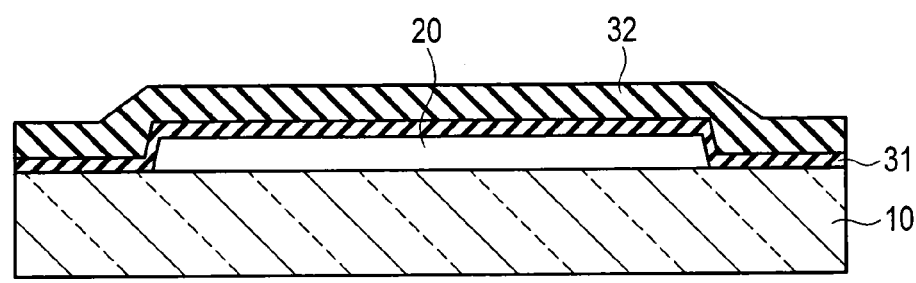
F I G. 4C
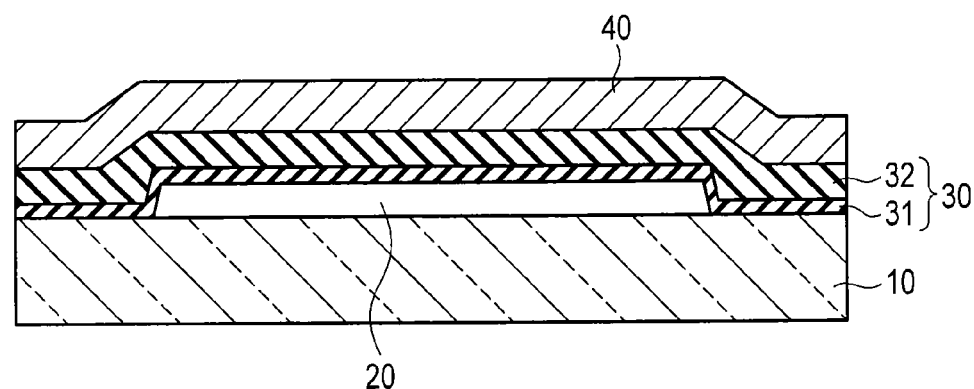
F I G. 4D

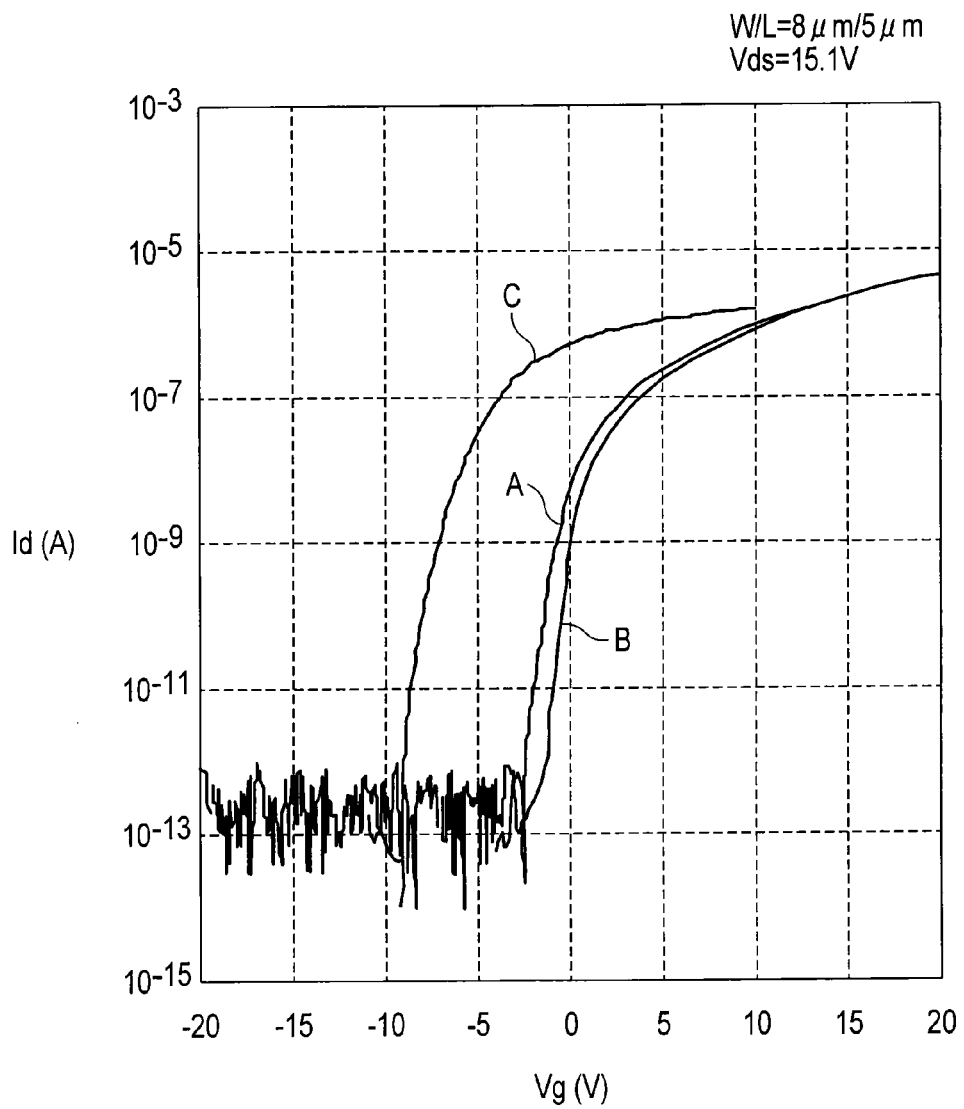
F I G. 5

THIN-FILM TRANSISTOR AND METHOD FOR MANUFACTURING THE SAME

CROSS-REFERENCE TO RELATED APPLICATIONS

This application is continuation of and claims the benefit of priority under 35 U.S.C. §120 from U.S. Ser. No. 14/256,267 filed Apr. 18, 2014, and claims the benefit of priority under 35 U.S.C. §119 from Japanese Patent Application No. 2013-107376 filed May 21, 2013, the entire contents of each of which are incorporated herein by reference.

FIELD

Embodiments described herein relate generally to a thin-film transistor using a channel of an oxide semiconductor and a method for manufacturing the same.

BACKGROUND

Recently, for higher definition and lower power consumption of a liquid crystal display, a thin-film transistor (TFT) comprising a channel layer of an oxide semiconductor such as an oxide of an alloy of indium, gallium, and zinc (IGZO) is in actual use. In a coplanar TFT of this kind, it is necessary to laminate a gate insulator film and a gate electrode material on an island-shaped IGZO film. However, because of the influence of a step in an end portion of the island-shaped IGZO, it is difficult to form the gate insulator film and gate electrode material conformally in coating. Generally, a step even larger than the already existing step of the IGZO is created after the gate insulator film is formed, and therefore the gate electrode material deposited thereon can not be connected well in the end portion of the IGZO (step-disconnection).

In the case of a polysilicon thin film transistor, when the polysilicon film is processed by a dry etching method with an etching gas, the etching conditions are adjusted such that its end portion becomes oblique to some extent with respect to the substrate. In this way, the coating of the gate insulator film can be conformal. In the case of an IGZO film, however, since wet etching with oxalic acid or the like is mainly employed, only a substantially vertical end portion can be made. As a result, the step-disconnection of the gate electrode material occurs in the end portion. When the width of the channel is narrow, the step-disconnection results in disconnection of the gate portion of the transistor from the lead-out wiring portion for forming a circuit. This leads to a problem of incapability of transistor operation.

As a film formation which enables conformal coating, silicon dioxide film formation by the chemical vapor deposition (CVD) method using a source gas of tetraethyl orthosilicate (TEOS) is well known. This material is used as a gate insulator film disposed on a polycrystalline silicon film having large convexoconcave, and can moderate the convexoconcave of the polycrystalline silicone film thereunder.

However, the following was found. That is, when a silicon dioxide film was formed with gaseous TEOS on the IGZO film, oxygen was lost from the IGZO surface by a chemical reaction between the gaseous TEOS and the IGZO surface. As a result, the IGZO film, which was originally a semiconductor, behaved as if it was a metal at the interface with the gate insulator film and became unable to perform the transistor operation. This was similarly observed in the cases where metal oxides other than IGZO were used as the semiconductor layer.

As described above, conventionally, when a silicon dioxide gate insulator film is formed with gaseous TEOS on an oxide semiconductor, the oxide semiconductor behaves as if it is a metal at the interface with the gate insulator film, causing a problem of incapability of transistor operation.

SUMMARY

In general, according to one embodiment, a thin-film transistor comprises an oxide semiconductor layer formed on a part of a substrate, a first gate insulator film of a silicon dioxide film formed on the oxide semiconductor layer and by the CVD method with a silane-based source gas, a second gate insulator film of a silicon dioxide film formed on the first gate insulator film by the CVD method with a TEOS source gas, and a gate electrode formed on the second gate insulator film.

Further, a method for manufacturing a thin-film transistor comprising forming an oxide semiconductor layer on a part of a substrate, forming a first gate insulator film of a silicon dioxide film on the semiconductor layer and the substrate by the CVD method with a silane-based source gas, forming a second gate insulator film of a silicon dioxide film on the first gate insulator film by the CVD method with a TEOS source gas, and forming a gate electrode on the second gate insulator film.

BRIEF DESCRIPTION OF THE DRAWINGS

FIGS. 4A to 4D are sectional views each showing a process of manufacturing a thin-film transistor according to the first embodiment;

FIG. 5 is a characteristic diagram of a thin-film transistor according to the first embodiment in comparison with conventional examples;

DETAILED DESCRIPTION

The basic concept of the present embodiments will be described prior to the detailed descriptions of the embodiments.

As mentioned above, for the prevention of the step-disconnection of the gate insulator film, it is effective to form a silicon dioxide film with gaseous TEOS. However, the use of gaseous TEOS causes the reduction of the IGZO film thereunder. Here, the inventors of the present invention have used the excellent coating of the silicon dioxide film with the gaseous TEOS and taken measures to prevent the metallization of the IGZO film. More specifically, a treatment for preventing the reduction of the IGZO surface was carried out and the silicon dioxide film with the gaseous TEOS later was formed in an experiment.

As a result, it was found to be effective to form a silicon dioxide film with a gaseous mixture of TEOS and oxygen after oxide plasma processing. It was also found to be advantageous to form a silicon dioxide film with the gaseous mixture of TEOS and oxygen after forming a silicon dioxide film just thin enough to cover the surface without using TEOS.

The above effectiveness can be similarly obtained also in the cases of oxide semiconductors in addition to IGZO. Further, the present invention is especially effective to a coplanar TFT in which a gate electrode is formed via a gate insulator film on an island-shaped oxide semiconductor layer.

A thin-film transistor according to an embodiment will now be described with reference to the accompanying drawings.

(First Embodiment)

Figure 1:
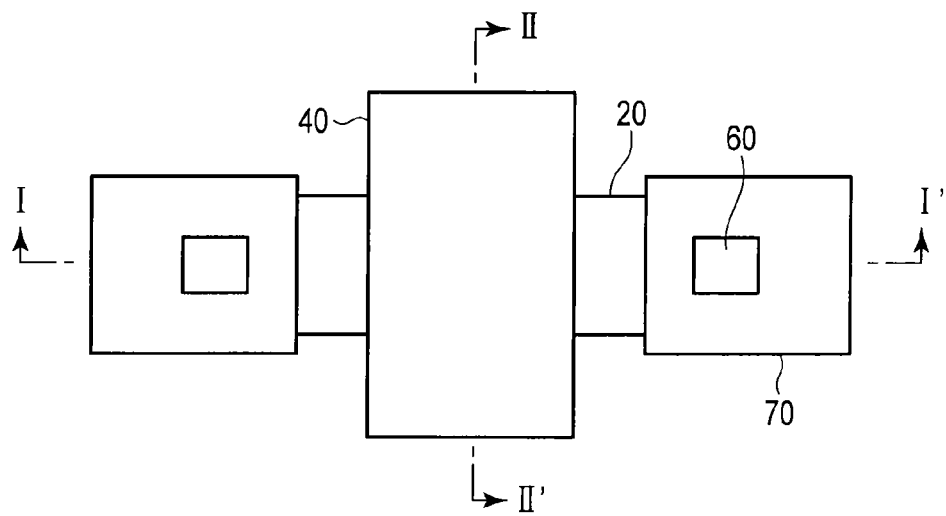
FIG. 1 is a plan view showing a schematic structure of a thin-film transistor according to a first embodiment.
Figure 2:
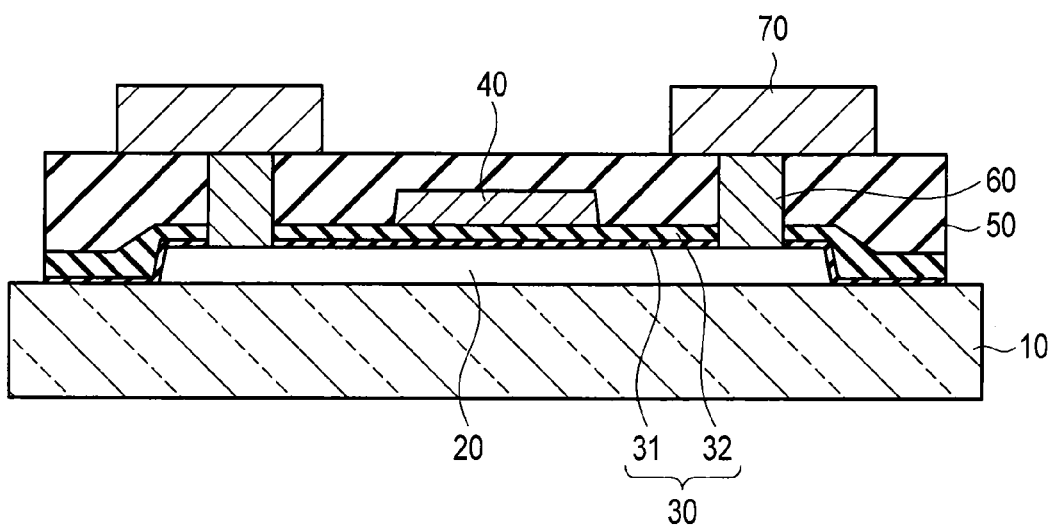
FIG. 2 is a sectional view (sectional view along the length of a channel) taken along arrow I-I' of FIG. 1.
Figure 3:
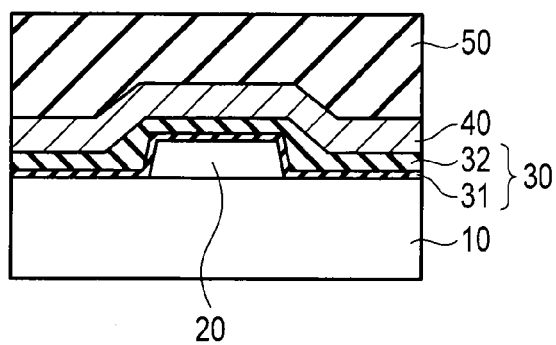
FIG. 3 is a sectional view (sectional view along the width of a channel) taken along arrow II-II' of FIG. 1.

FIGS. 1 to 3 are diagrams each showing a schematic structure of a thin-film transistor, especially, a coplanar TFT using IGZO as a channel, according to a first embodiment. FIG. 1 is a plane view, FIG. 2 is a sectional view taken along arrow I-I' of FIG. 1, and FIG. 3 is a sectional view taken along arrow II-II' of FIG. 1. This TFT is used, for example, for pixel switching in a liquid crystal display.

Reference number 10 in the diagrams denotes, for example, a transparent glass substrate which constitutes a part of a liquid crystal panel. On a part of the substrate 10, an oxide semiconductor layer 20 of IGZO is formed. The oxide semiconductor layer 20 is provided in a shape of an island to fit with a coplanar TFT formation region. The side surface of the end portion of the oxide semiconductor layer 20 is substantially vertical.

A gate insulator film 30 of a silicon dioxide film is formed on the substrate 10 in such a manner as to cover the oxide semiconductor layer 20. Here, the gate insulator film 30 has a laminated structure of a first silicon dioxide film (first gate insulator film) 31 and a second silicon dioxide film (second gate insulator film) 32, which will be described later. In the first silicon dioxide film 31, the step of the oxide semiconductor layer 20 thereunder is reflected, thus creating a steep step. Further, the second silicon dioxide film 32 is formed conformally in the step portion of the first silicon dioxide film 31, and therefore, a step in a portion corresponding to the end portion of the oxide semiconductor layer 20 is gentle.

On the gate insulator 30, a gate electrode 40 of MoW or the like is formed. Then, a source/drain region (not shown) in the oxide semiconductor layer 20 is formed to sandwich the gate electrode 40, whereby the coplanar TFT is constructed.

Further, an interlayer insulator 50 of a silicon dioxide film or the like is formed to cover the gate electrode 40. In the interlayer insulator 50, a contact hole is formed. By filling an electric conductor in this hole, the source/drain electrode 60 is formed. On the interlayer insulator 50, a wiring layer 70 is formed to be connected to the source/drain electrode 60.

FIGS. 4A to 4D are sectional views each showing a process of manufacturing the TFT according to the present embodiment, and corresponding to the section of FIG. 3.

First, as shown in FIG. 4A, the oxide semiconductor layer 20 is formed on the glass substrate 10 to have a thickness of 50 nm, and is patterned into a shape of the device.

The oxide semiconductor layer 20 is an oxide of an alloy of indium, gallium and zinc (IGZO). The IGZO film may be formed, for example, by a solid reaction method wherein the mixed material including In, Ga and Zn is calcinated and gradually cooled, or by the CVD method or the metalorganic chemical vapor deposition (MOCVD) method, or the like. After the oxide semiconductor layer 20 is formed, a mask of a silicon nitrogen film (not shown) or the like is formed on the oxide semiconductor layer 20. Then, the oxide semiconductor layer 20 is processed into a desired pattern by wet etching with oxalic acid. Here, the sidewall of the end portion of the oxide semiconductor layer 20 is substantially vertical.

Next, as shown in FIG. 4B, by the CVD method with an $N_2O$—$SiH_4$-based source gas, the first silicon dioxide film 31 is formed on the substrate 10 to have a thickness of 10 nm to cover the oxide semiconductor layer 20. Here, in the first silicon dioxide film 31, the step of the oxide semiconductor layer 20 is reflected, thus creating a steep step.

Then, as shown in FIG. 4C, the second silicon dioxide film 32 is formed on the first silicon dioxide film 31 to have a thickness of 70 nm by the CVD method with a TEOS source gas. Here, by using the gaseous TEOS, the second silicon dioxide film 32 is formed conformally even in the step portion of the first silicon dioxide film 31, and therefore a slope on the side surface of the silicon dioxide film 32 becomes gentle. That is, the gate insulator film 30 comprising the silicon dioxide films 31 and 32 has a gentle step even in the end portion of the oxide semiconductor layer 20. Further, when the silicon dioxide film 32 is formed, the silicon dioxide film 31 thereunder prevents an escape of oxygen from the oxide semiconductor layer 20.

After that, as shown in FIG. 4D, by depositing MoW up to a thickness of 200 nm on the gate insulator film 30 by a sputtering method, the gate electrode 40 is formed. Here, since the slope of the side surface of the gate insulator film 30 is gentle, the step-disconnection of the gate electrode 40 will not occur.

From here, the patterning of the gate electrode 40, the formation of the interlayer insulator 50, the formation of the source/drain electrode 60, and the like follow to complete the structure shown in FIGS. 1 to 3.

Vg-Id characteristics of the TFT manufactured by the above method and those of TFTs manufactured by conventional methods are shown in FIG. 5. Reference symbol A in FIG. 5 indicates a case (before improvement) where a single-layer gate insulator film is formed with gaseous $SiH_4$+$N_2O$. Reference symbol B indicates a case (after improvement) where a two-layer gate insulator film is formed with the gaseous $SiH_4$+$N_2O$ and the gaseous TEOS according to the present embodiment. Reference symbol C indicates a case (before improvement) where a single-layer gate insulator film is formed with the gaseous TEOS.

In reference symbol A, fine device characteristics can be obtained, but there is a risk of step-disconnection of a gate electrode. In reference symbol B, device characteristics substantially the same as those of reference symbol A can be obtained, and the step-disconnection of the gate electrode can be prevented as well. In reference symbol C, though the step-disconnection of the gate electrode can be prevented, the threshold voltage shifts to negative, causing degradation of the device characteristics. From the above, it is understood that a two-layer gate insulator film of the present embodiment can prevent step-disconnection of a gate electrode without causing degradation of device characteristics.

In addition, in the present embodiment, by thinning the silicon dioxide film 31, which is the first layer formed with an $N_2O$—$SiH_4$-based gas, capacitance-voltage (C-V) characteristics substantially the same as those of polysilicon TFT are obtained. Further, as to the shift of the threshold voltage, in particular, the shift to the negative side becomes small. Therefore, the current when Vg is zero will not become large, providing significant advantages also in designing a circuit.

As mentioned above, in the present embodiment, after the first silicon dioxide film 31 is formed on the oxide semiconductor layer 20 with the $N_2O$—$SiH_4$-based gas, the second silicon dioxide film 32 is formed with the gaseous TEOS. Consequently, it is possible to prevent the reduction of the oxide semiconductor layer 20 which occurs when the gate insulator film 30 comprising the silicon dioxide films 31 and 32 is formed. Further, since the step on the gate insular film 30 is gentle, step-disconnection of the gate electrode 40 can be prevented. Therefore, the device characteristics of the TFT using IGZO as a channel can be improved.

In addition, since this is a coplanar TFT, the size of the transistor can be reduced in comparison with that of an inverted staggered TFT. Further, since the capacitive components of the gate and the source/drain are reduced, this transistor can operate at high speed. Therefore, it is especially suited for a high-definition panel.

(Second Embodiment)

Figure 6A:
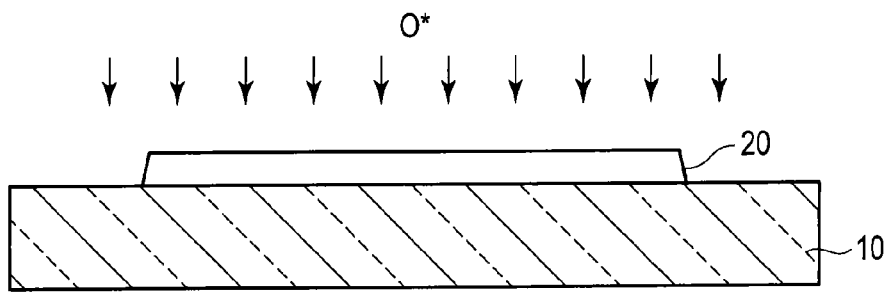
FIGS. 6A and 6B are sectional views each showing a process of manufacturing a thin-film transistor according to a second embodiment.
Figure 6B:
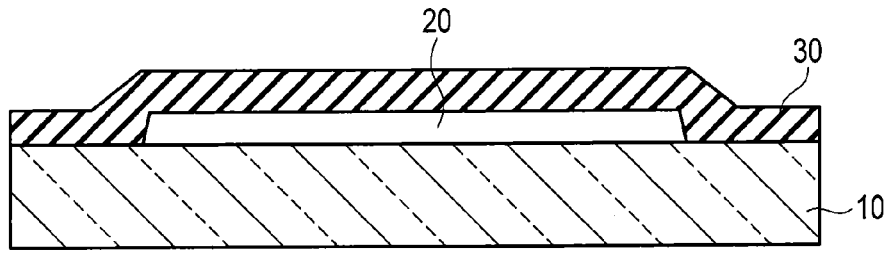

FIGS. 6A and 6B are sectional views each showing a process of manufacturing a thin-film transistor according to a second embodiment. Note that the portions identical to those of FIGS. 4A to 4D are denoted with the same reference numbers and will not described in detail.

The present embodiment is different from the first embodiment described earlier in respect of treating the oxide semiconductor layer with oxygen plasma processing instead of forming a gate insulator film into two layers.

First, in a manner similar to that in FIG. 4A of the first embodiment, the oxide semiconductor 20 of IGZO is formed on the glass substrate 10 and patterned into the shape of the device.

Next, as shown in FIG. 6A, a surface treatment with oxygen plasma is carried out on the oxide semiconductor layer 20. More specifically, an oxygen radical is produced by generating a plasma discharge in a chamber into which gaseous $N_2O$ or $O_2$ is introduced, and is directed onto the surface of the oxygen semiconductor layer 20. This oxygen plasma processing prevents the reduction of the oxygen semiconductor layer 20 which occurs when the gate insulator film is formed in the subsequent process. That is, by introducing an excessive amount of oxygen in advance in consideration of oxygen escaping when TEOS is used, the reduction of the oxygen semiconductor layer 20 can be inhibited.

Then, as shown in FIG. 6B, the gate insulator film 30 is formed on the substrate 10 to cover the oxide semiconductor layer 20 by forming a silicon dioxide film by the CVD method with the TEOS source gas. Here, by using TEOS, the step portion of the semiconductor layer 20 is formed conformally and thus the step of the gate insulator film 30 is gentle. Further, by performing the surface treatment with oxygen plasma, the reduction of the oxide semiconductor layer 20 can be inhibited.

After that, in a similar manner as the first embodiment, the gate electrode 40 is formed on the gate insulator film 30. Here, since the slope of the side surface of the gate insulator film 30 is gentle, the step-disconnection of the gate electrode 40 will not occur.

From here, in a manner similar to the first embodiment, the formation of the interlayer insulator 50 and the source/drain electrode 60, and the like follow to complete the structure of the transistor.

As described above, in the present embodiment, the surface treatment with oxygen plasma is carried out before the gate insulator film 30 is formed on the oxide semiconductor layer 20 by the CVD method with the gaseous TEOS. Therefore, the reduction of the oxide semiconductor layer 20 occurring when the gate insulator film 30 is formed with the gaseous TEOS can be prevented. Consequently, effects similar to those of the first embodiment can be obtained.

(Third Embodiment)

Figure 7A:
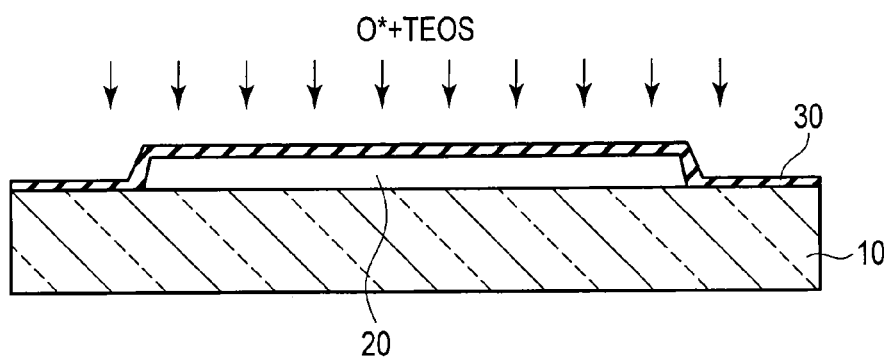
FIGS. 7A and 7B are sectional views each showing a process of manufacturing a thin-film transistor according to a third embodiment.
Figure 7B:
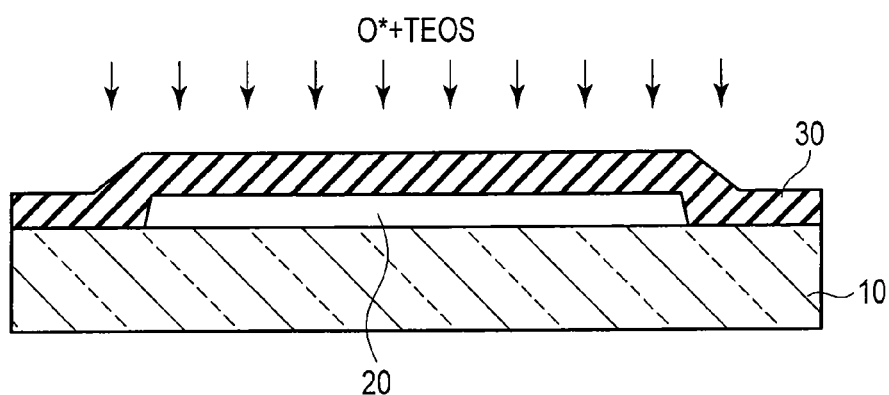

FIGS. 7A and 7B are sectional views each showing a process of manufacturing a thin-film transistor according to a third embodiment. Note that the portions identical to those of FIGS. 4A to 4D are denoted with the same reference number and will not be described in detail.

The present embodiment is different from the second embodiment described earlier in respect of performing the oxygen plasma irradiation and the film formation with the gaseous TEOS simultaneously instead of processing with oxygen plasma in advance before forming a film with TEOS.

First, in a manner similar to that in FIG. 4A of the first embodiment, the oxide semiconductor layer 20 of IGZO is formed on the glass substrate 10 and is patterned into a shape of the device.

Next, as shown in FIG. 7A, the surface treatment with oxygen plasma is carried out on the oxygen semiconductor layer 20 while a silicon dioxide film is formed by the CVD method with the TEOS source gas. In this way, the gate insulator film 30 is formed on the substrate 10 to cover the oxide semiconductor layer 20. Here, by using TEOS, the gate insulator film 30 is formed conformally even in the step portion of the oxide semiconductor layer 20. Further, by performing the surface treatment with oxygen plasma, the escape of oxygen from the oxide semiconductor can be inhibited.

Then, as shown in FIG. 7B, the gate insulator film 30 is formed up to a thickness of 80 nm and the slope of the side surface of the gate insulator film 30 become gentle.

As described above, in the present embodiment, by performing the surface treatment with oxygen plasma and the silicon dioxide film formation with the gaseous TEOS, it is possible to prevent the escape of oxygen from the oxide semiconductor layer 20 and to make the slope of the side surface of the gate insulator film 30 gentle. Therefore, the benefits similar to those of the first embodiment can be obtained.

(Modified Example)

Note that the present invention will not be limited to each of the embodiments described above.

Although IGZO is used as the oxide semiconductor layer in the embodiments, any of metal oxide semiconductors such as ZnO, In2O3, and InGaO, may be used instead.

In the first embodiment, the source gas used in forming the first silicon dioxide film is not necessarily limited to $N_2O$—$SiH_4$ but may be a silane-based gas which can prevent reduction, such as $N_2O$—$SiH_4$. Moreover, the carrier gas such as Ar or He in addition to the source gas can be comprised.

In addition, the present embodiments can be used not only in liquid crystal displays but also in other displays for pixel switching. Besides the liquid crystal displays, the present embodiments are also applicable to various devices comprising a transistor on an oxide semiconductor layer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing a thin-film transistor comprising:
   forming an oxide semiconductor layer on a part of a substrate;
   forming a first gate insulator film of a silicon dioxide film on the oxide semiconductor layer and the substrate to cover end portions of the oxide semiconductor layer, by the CVD method with a silane-based source gas other than a TEOS source gas;

forming a second gate insulator film of a silicon dioxide film on the first gate insulator film by the CVD method with the TEOS source gas, the second gate insulator film being out of contact with the oxide semiconductor layer; and forming a gate electrode on the second gate insulator film.

2. The method of claim 1, wherein gas consisting mainly of $SiH_4$ and $N_2O$ is used as the silane-based source gas.

3. The method of claim 1, wherein an oxide of an alloy of indium, gallium and zinc (IGZO) is used as the oxide semiconductor layer.

4. The method of claim 1, wherein the forming of the oxide semiconductor layer includes forming the oxide semiconductor layer on the substrate and subsequently processing the oxide semiconductor layer by wet etching into a shape of an island.

* * * * *